(12) United States Patent
Kim

(10) Patent No.: US 8,586,863 B2
(45) Date of Patent: Nov. 19, 2013

(54) SOLAR CELLS AND METHODS OF FORMING THE SAME

(75) Inventor: Yun-Gi Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 508 days.

(21) Appl. No.: 12/562,400

(22) Filed: Sep. 18, 2009

(65) Prior Publication Data

US 2010/0071764 A1    Mar. 25, 2010

(30) Foreign Application Priority Data

Sep. 19, 2008 (KR) .................. 10-2008-0092226

(51) Int. Cl.
*H01L 31/00* (2006.01)

(52) U.S. Cl.
USPC ........................................... 136/256

(58) Field of Classification Search
USPC .......................... 136/252, 256, 258
See application file for complete search history.

(56) References Cited

U.S. PATENT DOCUMENTS

| | | | |
|---|---|---|---|
| 4,135,950 A * | 1/1979 | Rittner .................... | 136/255 |
| 4,322,571 A | 3/1982 | Stanbery | |
| 4,916,503 A * | 4/1990 | Uematsu et al. ........... | 257/436 |
| 2004/0259335 A1 * | 12/2004 | Narayanan et al. ........ | 438/584 |

FOREIGN PATENT DOCUMENTS

| | | |
|---|---|---|
| JP | 2004-134494 | 4/2004 |
| JP | 2004-134499 | 4/2004 |
| JP | 2006-210394 | 8/2006 |
| KR | 1020020059186 A | 7/2002 |
| KR | 1020020059189 A | 7/2002 |
| KR | 1020060115296 A | 11/2006 |

OTHER PUBLICATIONS

Machida et al "Efficiency improvement in polycrystalline silicon solar cell with grooved surface", Photovoltaic Specialists Conference, 1991., Conference Record of the Twenty Second IEEE , Oct. 7-11, 1991, vol. 2, pp. 1033-1034 (1991).*

"Webster's Ninth New Collegiate Dictionary", Merriam-Webster Inc. Springfield MA, pp. 609 and 1073 (1986).*

* cited by examiner

*Primary Examiner* — Alexander Kollias
(74) *Attorney, Agent, or Firm* — Cantor Colburn LLP

(57) ABSTRACT

A solar cell is provided with a semiconductor substrate including a light-receiving surface, a back surface, a first region of a first conductivity type disposed on the back surface, a second region of a second conductivity type disposed on the light-receiving surface, and a PN junction at the boundary between the first and second regions. An electrode is provided on the light-receiving surface to expose a portion of the light-receiving surface, and the semiconductor substrate includes a plurality of recesses formed by recessing the exposed portion of the light-receiving surface. The recesses may function as a texturing structure.

13 Claims, 14 Drawing Sheets

SOLAR CELLS AND METHODS OF FORMING THE SAME

CROSS-REFERENCE TO RELATED APPLICATION

This application claims priority to Korean Patent Application No. 10-2008-0092226, filed on Sep. 19, 2008, and all the benefits accruing therefrom under 35 U.S.C. §119, the content of which in its entirety is herein incorporated by reference.

BACKGROUND

1. Field

The disclosure relates to solar cells and methods of forming the same.

2. Description of the Related Art

A solar cell generates power. Solar cells generally contain semiconductors. Electron-hole pairs are formed in the semiconductor when incident light impinges on the semiconductor. As a result of an electric field generated at a PN junction, electrons are transferred to an N-type semiconductor and holes are transferred to a P-type semiconductor to generate power.

Light impinging on the solar cell may be reflected onto the solar cell from an incident surface. Incident surfaces are those that focus light on the solar cell. Examples of incident surfaces are lenses, reflective mirrors, and the like. Characteristics of the solar cell may be degraded by optical losses resulting from the reflection of the light that impinges on the solar cell. In order to suppress optical loss that occur in the solar cell, the solar cell may be provided with an uneven incident surface. In order to accomplish this, a surface of a crystalline silicon substrate that receives light may be etched to form pyramids. This etching of the silicon substrate is to form pyramids is referred to as texturing. Due to the presence of the pyramids, the reflection of the incident light is reduced to increase the rate of light absorption and the incident light enters the interior of silicon according to Snell's law.

SUMMARY

An aspect of the present invention provides a solar cell. In one embodiment, the solar cell may include a semiconductor substrate including a light-receiving surface, a back surface facing the light-receiving surface, a first region of a first conductivity type disposed on the back surface, a second region of a second conductivity type disposed on the light-receiving surface, and a PN junction at a boundary between the first and second regions; and an electrode disposed on the light-receiving surface to expose a portion of the light-receiving surface. The semiconductor substrate includes a plurality of recesses formed by recessing the exposed portion of the light-receiving surface, and the electrode surrounds the respective recesses causing the recesses to be spaced apart form one another.

In another exemplary embodiment, the solar cell may include a semiconductor substrate including a light-receiving surface, a back surface facing the light-receiving surface, a first region of a first conductivity type disposed on the back surface, a second region of a second conductivity type disposed on the light-receiving surface, and a PN junction at a boundary between the first and second regions; a first electrode being in contact with the first region on the back surface; a second electrode disposed on the light-receiving surface; and an anti-reflection film disposed to cover the second electrode and the second region.

In yet another exemplary embodiment, the solar cell may include a semiconductor substrate including a light-receiving surface, a back surface facing the light-receiving surface, a first region of a first conductivity type disposed on the back surface, a second region of a second conductivity type disposed on the light-receiving surface, and a PN junction at a boundary between the first and second regions. The second region is divided into a plurality of unit regions to be spaced apart from one another.

Another aspect of the present invention provides a method of forming a solar cell. In an exemplary embodiment, the method may include providing a semiconductor substrate including a first surface, a second surface facing the first surface, and a first region of a first conductivity type formed at the first surface; forming an electrode on the second surface to expose a portion of the second surface; and removing the exposed portion of the second surface using the electrode as a mask to form a recess.

BRIEF DESCRIPTION OF THE DRAWINGS

The above and other aspects, advantages and features of this disclosure will become more apparent by describing in further detail exemplary embodiment thereof with reference to the accompanying drawings, in which:

FIGS. 3A through 7A are exemplary schematic top views (plan) illustrating a method of forming a solar cell according to embodiments, and FIGS. 3B through 7B are exemplary schematic cross-sectional view taken along the line corresponding to the line I-I' in FIG. 1A.

DETAILED DESCRIPTION

Figure 1A:
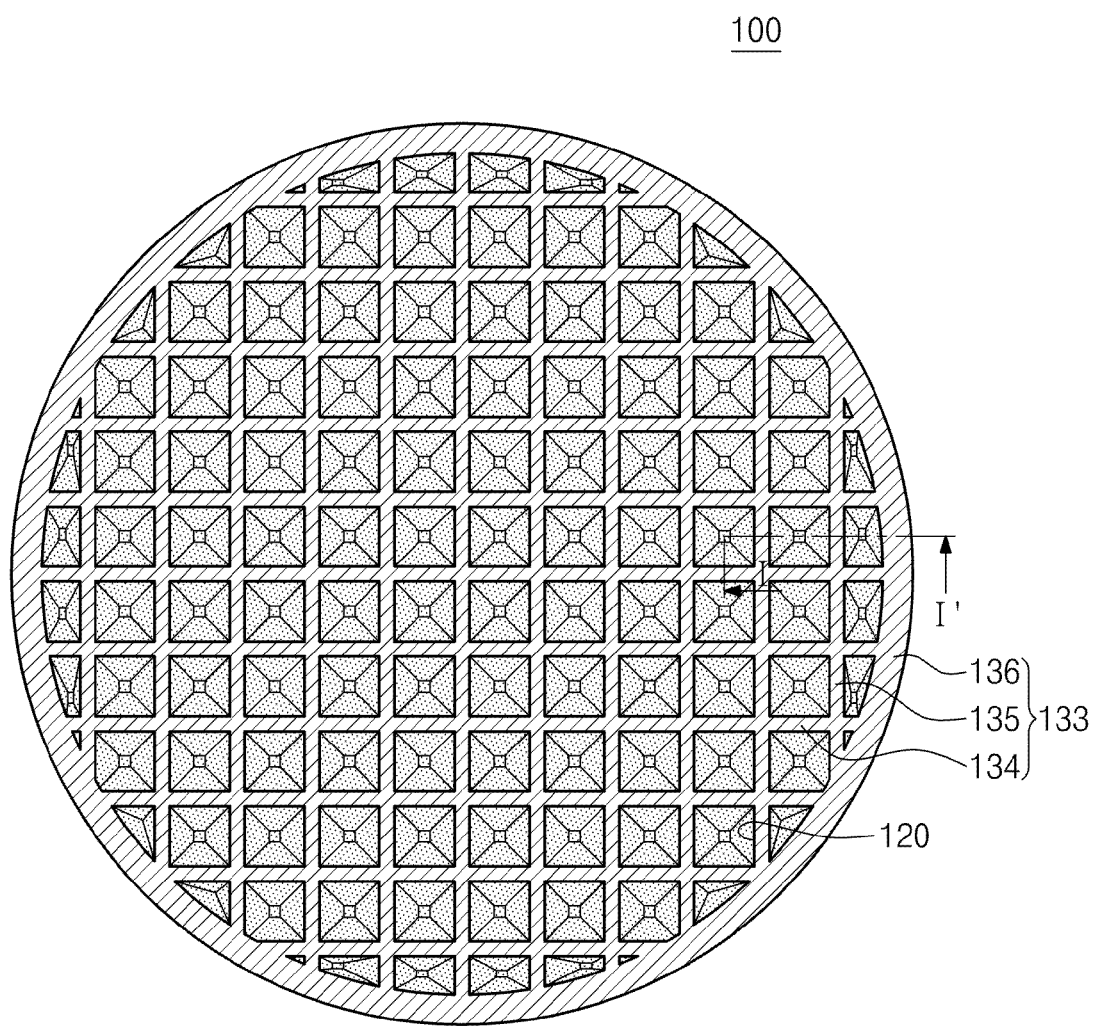
FIG. 1A is an exemplary schematic top view (plan) of a solar cell.

The disclosure will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art.

In the drawings, the thicknesses of layers and regions are exaggerated for clarity. It will also be understood that when a layer is referred to as being "on" another layer or substrate, it can be directly on the other layer or substrate, or intervening layers may also be present. In exemplary embodiments, the use of the terms first, second, third, etc. does not denote any order or importance, but rather the terms first, second, third, etc. are used to distinguish one element from another. Exemplary embodiments described herein may include their complementary embodiments, respectively. Moreover, expressions "heavily doped (doping)" and "lightly doped (doping)" are merely used for a relative comparison therebetween.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 1B:
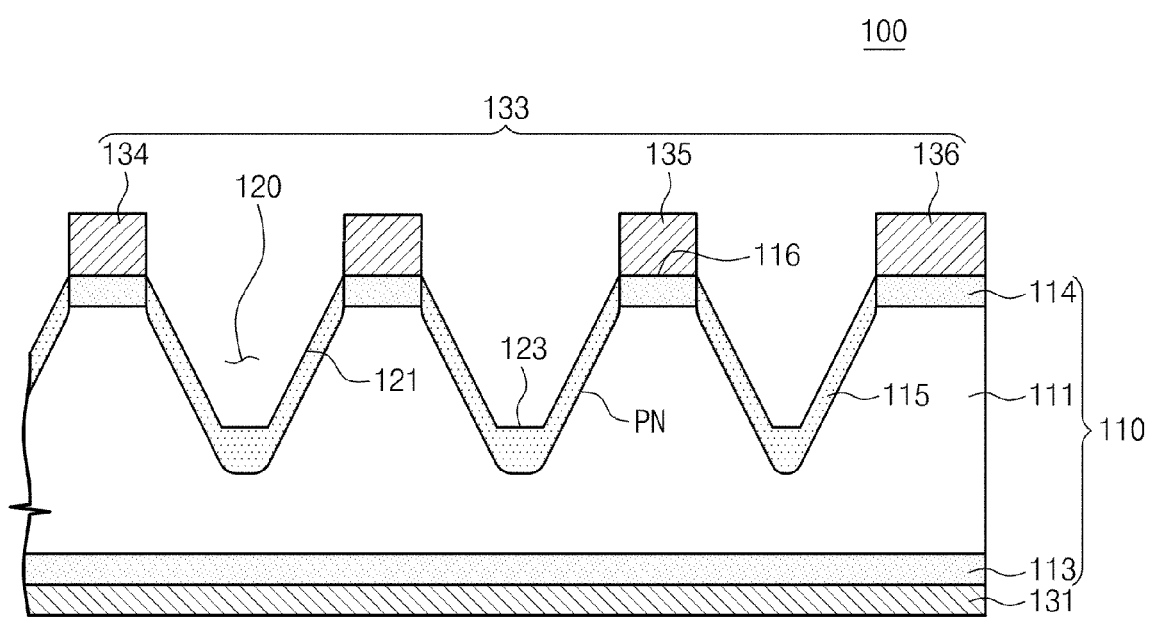
FIG. 1B is an exemplary schematic cross-sectional view taken along the line I-I' in FIG. 1A.

An exemplary solar cell will now be described with reference to FIGS. 1A and 1B. The solar cell 100 may include a semiconductor substrate 110 having a front surface receiving sunlight (hereinafter referred to as "light-receiving surface") and a back surface. The back surface faces the light-receiving surface. When viewed from the top view, the semiconductor substrate 110 may have a cross-sectional area that can have a variety of geometrical shapes. In one embodiment, the semiconductor substrate 110 may be a single-crystalline silicon wafer having a circular shape. Examples of other geometrical shapes (not shown) are square, rectangular, triangular or polygonal (e.g., pentagonal, hexagonal, decagonal, tetragonal, or the like). The semiconductor substrate 110 may include a first region 111 of a first conductivity type formed at a lower portion adjacent to the back surface, a second region 115 of a second conductivity type formed at an upper portion adjacent to the light-receiving surface, and a PN junction (labeled PN in FIG. 1B) formed at the boundary between the first and second regions 111 and 115. The first conductivity type may be a P-type, and the second conductivity type may be a N-type.

The first region 111 may be formed by lightly doping a body of the semiconductor substrate 110 with impurities, such as boron (B), of the first conductivity type. The second region 115 may be formed by heavily doping the upper portion of the semiconductor substrate 110 with impurities, such as phosphorus (P) or arsenic (As), to produce a second region 115 of the second conductivity type. The second region 115 may have an impurity concentration of approximately $10^{19} \sim 10^{21}/cm^3$.

A first electrode 131 may be provided on the back surface. A second electrode 133 may be provided on the light-receiving surface and disposed to expose a portion of the light-receiving surface. The exposed portion of the light-receiving surface may be surrounded by the second electrode 133. The exposed portion of the light-receiving surface may have various plane figures, such as a circle or a polygon, which may be defined by a closed curve or a closed polyline (i.e., a line that closes upon itself and has four or more edges). The second electrode 133 may exhibit, for example, a grid shape and the polygon may be tetragon. The second electrode 133 may include, for example, a first electrode part 134 extending in a first direction and a second electrode part 135 extending in a second direction that intersects with the first direction. The second electrode 133 may further include a third electrode part 136, which is connected to tips of the first electrode part 134 and tips of the second electrode part 135, and may extend along the periphery of the edge of the semiconductor substrate 110. If the edge of the semiconductor substrate 110 is circular, the third electrode part 136 may extend along the circumference of the edge of the semiconductor substrate 110.

Each of the first and second electrodes 131 and 133 may be made of aluminum ("Al"), copper ("Cu"), tungsten ("W"), titanium ("Ti"), titanium nitride ("TiN"), tungsten nitride ("WN"), metal silicide or a stacked structure thereof such as, for example, aluminum disposed upon titanium nitride, which is disposed upon titanium ("Ti/TiN/Al") or tungsten disposed upon titanium nitride, which is disposed upon titanium ("Ti/TiN/W"). The first electrode 131 may be, for example, a P-type electrode and the second electrode 133 may be, for example, an N-type electrode.

The semiconductor substrate 110 may have a plurality of recesses 120 formed by recessing a portion of the light-receiving surface, which is exposed by the second electrode 133. A sidewall 136 of the second electrode 133 may be self-aligned with the edge of the recesses 120. Each of the recesses 120 may be surrounded by the second electrode 133. The recesses 120 may be spaced to be separated from each other. A protrusive surface 116 corresponding to a bottom surface of the second electrode 133 may be provided between the recesses 120. That is, it may be understood that the light-receiving surface includes the recesses 120 and the protrusive surface 116. Each of the recesses 120 may have a side surface (hereinafter referred to as "inclined surface") 121 inclined to the light-receiving surface. Each of the recesses 120 may further have a bottom surface 123 extending from the inclined surface 121. The bottom surface 123 may be provided at the center of the respective recesses 120 and substantially parallel with the light-receiving surface. Furthermore, the bottom surface 123 may decrease in size to form a vertex, whose apex would point towards the first electrode 131. Each of the recesses 120 may have a depth of several micrometers. The recesses 120 may function as a texturing structure for efficiently absorbing light. At least one of the recesses 120 may have a different size or shape than the others. In one embodiment, the recesses formed at the center of the semiconductor substrate are periodic whereas those formed at the edge of the semiconductor substrate are aperiodic. Recesses 120 formed at the center of the semiconductor substrate 110 may have more uniform size or shape, as compared to recesses 120 adjacent to the edge of the semiconductor substrate 110. In addition, the recesses 120 formed at the center of the semiconductor substrate 110 may have a uniform distribution, as compared to the recesses 120 adjacent to the edge of the semiconductor substrate 110. In one embodiment, recesses 120 formed adjacent to the edge of the semiconductor substrate 110 may be asymmetrical in shape and may have a different depth when compared with the recesses 120 that are disposed in the center of the semiconductor substrate 110.

The second region 115 of the second conductivity type may be provided at the recesses 120. For this reason, the second region 115 may be self-aligned with the sidewall of the second electrode 133. The second region 115 may be divided into unit regions by the second electrode 133 to be spaced apart from one another. Each of the unit regions may be surrounded by the second electrode 133. At least one of the unit regions may have a different size or shape than the others. Unit regions formed at the center of the semiconductor substrate 110 may have a uniform size or shape, when compared to unit regions adjacent to the edge of the semiconductor substrate 110.

The unit regions formed at the center of the semiconductor substrate 110 may have a regular distribution, as compared to the unit regions adjacent to the edge of the semiconductor substrate 110. The unit regions may have a similar shape to the recesses 120, respectively. That is, each of the unit regions may have the shape of an open cup with a wider top than a bottom. The bottom of the cup may include a horizontal section. A horizontal section of the cup may have various circular or polygonal shapes.

A first impurity-doped layer 113 may be provided between the first electrode 131 and the first region 111. The first impurity-doped layer 113 may be heavily doped with impurities of the first conductivity type. The first impurity-doped layer 113 may act as a back surface field (BSF) impurity layer to improve the collection of current. A second impurity-doped layer 114 may be provided between the second electrode 133 and the first region 111, i.e., at the protrusive surface 116. The second impurity-doped layer 114 is disposed on the first region 111. The second impurity-doped layer 114 may include high-concentration impurities of the second conductivity type. The second region 115 and the second impurity-doped layer 114 may be connected to constitute a second conductive region. However, since the second impurity-doped layer 114 is covered with the second electrode 113, only the second region 115 may serve to receive light.

Figure 2:
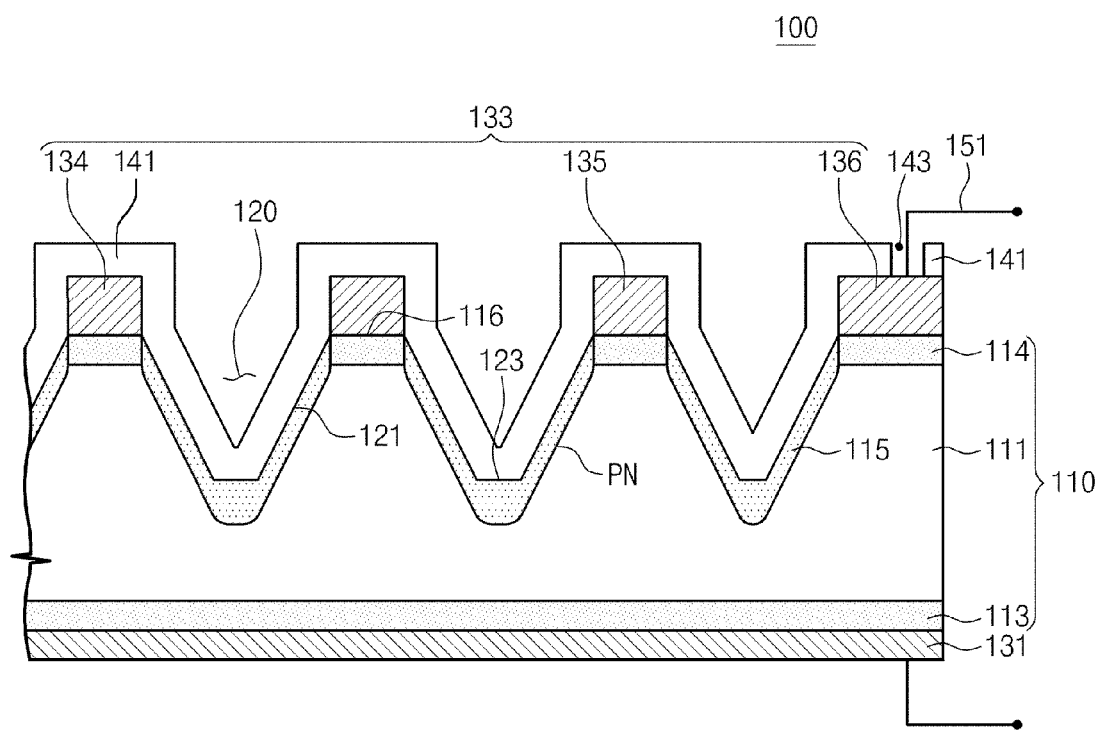
FIG. 2 is an exemplary schematic cross-sectional view of a solar cell, which is taken along the line corresponding to the line I-I' in FIG. 1A.

Referring to FIG. 2, the above-described solar cell 100 may further include an anti-reflection film 141, which may be provided to cover the second electrode 133 and the recesses 120. The anti-reflection film 141 is disposed on the second electrode 133 and on the recesses 120 as well. The anti-reflection film 141 may cover the second region 115 provided at the recesses 120. When an optical thickness of the anti-reflection film 141 is equal to about ¼ wavelength of incident light, the reflectance of the anti-reflection film 141 may decrease. In one embodiment, when the optical thickness of the anti-reflection film 141 is equal to about ¼ wavelength of incident light, the reflectance of the anti-reflection film 141 is minimized. The anti-reflection film 141 may have a double-layer configuration to reduce an optical thickness error arising from a single-layer configuration. The anti-reflection film 141 may be made of a conventional anti-reflection coating ("ARC") material such as silicon oxide, silicon nitride or a stacked layer thereof. The anti-reflection film 141 may protect the entire light-receiving surface of the solar cell 100.

Exterior wiring 151 may be further provided, which is connected to the first electrode 131 and the second electrode 133. Power generated between the first and second electrodes 131 and 133 may be output to the exterior via the exterior wiring 151. In order to connect the second electrode 133 with the exterior wiring 151, the anti-reflection film 141 may have an opening 143, which exposes a pad portion of the second electrode 133.

A method of forming a solar cell according to embodiments will now be described below in detail.

Figure 3A:
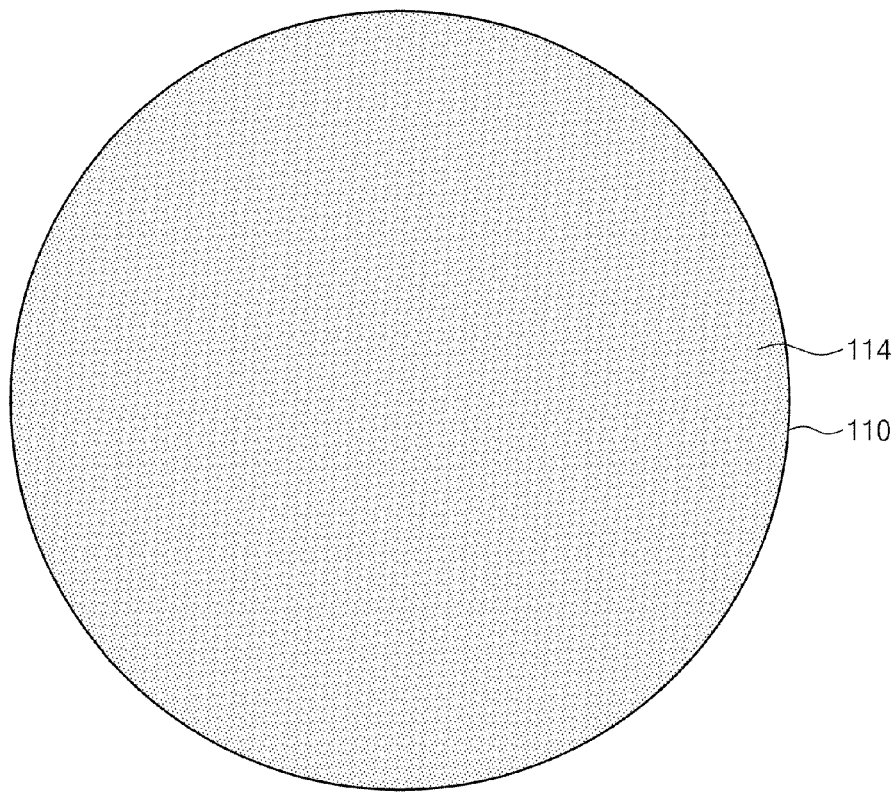
Figure 3B:
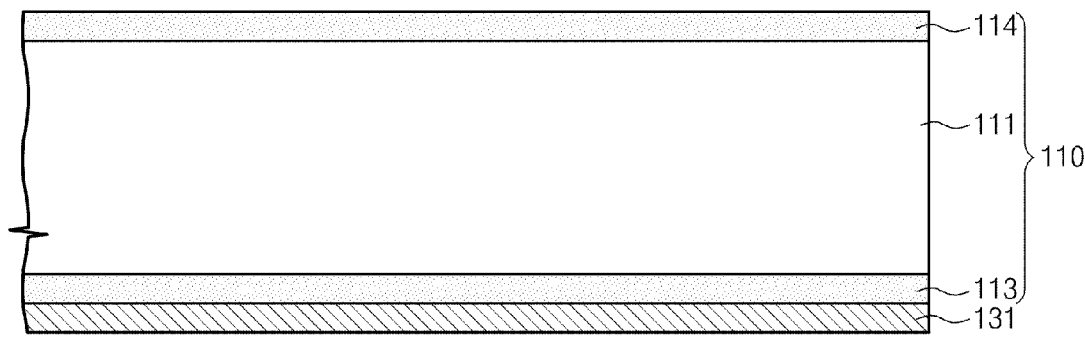

Referring to FIGS. 3A and 3B, a semiconductor substrate 110 is provided, which may have a light-receiving surface and a back surface facing the light-receiving surface. The semiconductor substrate 110 may be a circular silicon wafer, which may be formed of, for example, single-crystalline silicon. The semiconductor substrate 110 may include low-concentration impurities of a first conductivity type.

A first impurity-doped layer 113 including impurities of the first conductivity type may be formed at the back surface of the semiconductor substrate 110. The first impurity-doped layer 113 is disposed on an opposing surface of the semiconductor substrate 110 from the surface that contacts the second impurity-doped layer 114. The first impurity-doped layer 113 may be formed by heavily doping the back surface of the semiconductor substrate 110 with impurities (e.g., boron (B)) of the first conductivity type and annealing the heavily doped back surface. A first conductive layer may be disposed on the first impurity-doped layer 113 to constitute a first electrode 131. The first conductive layer may be formed of a material selected from the group consisting of Al, Cu, Ni, W, Ti, TiN, WN, a metal silicide, or the like, or a combination thereof. In one embodiment, the first electrode 131 may comprise a stacked layer (e.g., comprising a plurality of layers in contact with one another). The first conductive layer may be formed of, for example, Ti/TiN/Al or Ti/TiN/W.

A second impurity-doped layer 114 including impurities of a second conductivity type may be formed at the light-receiving surface of the semiconductor substrate 110. The second impurity-doped layer 114 may be formed by heavily doping an upper portion of the semiconductor substrate 110 with impurities (e.g., phosphorus (P) or arsenic (As)) of the second conductivity type and annealing the heavily doped upper portion. The region of the semiconductor substrate 110 between the first impurity-doped layer 113 and the second impurity-doped layer 114 may be defined as a first region 111 and may include impurities of the first conductivity type.

Figure 4A:
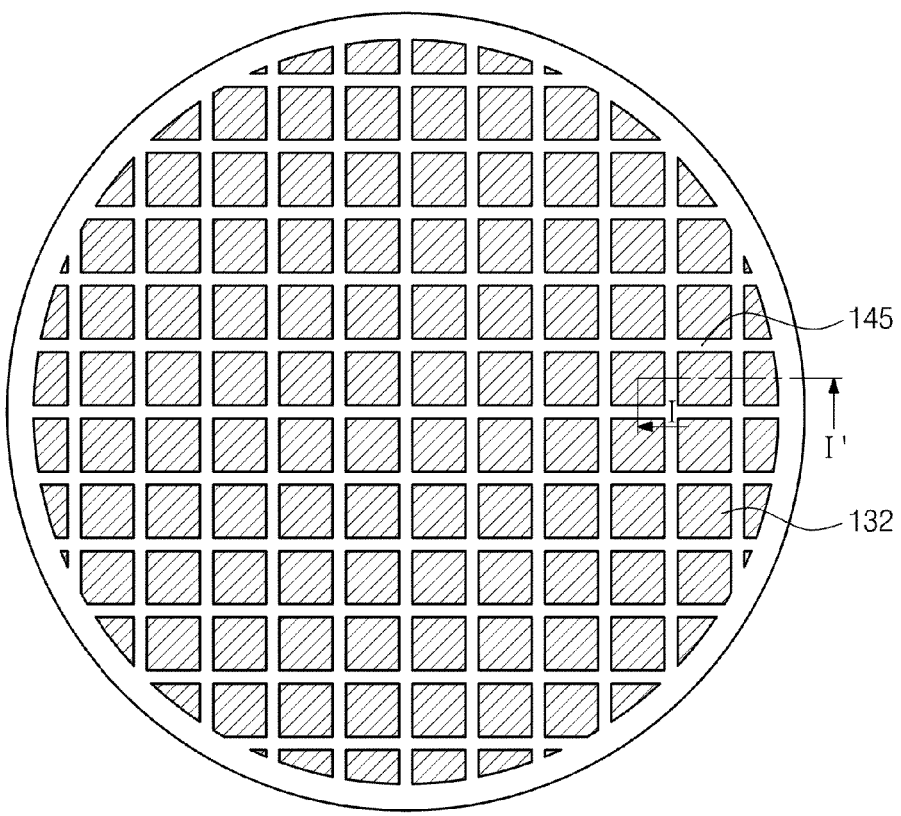
Figure 4B:
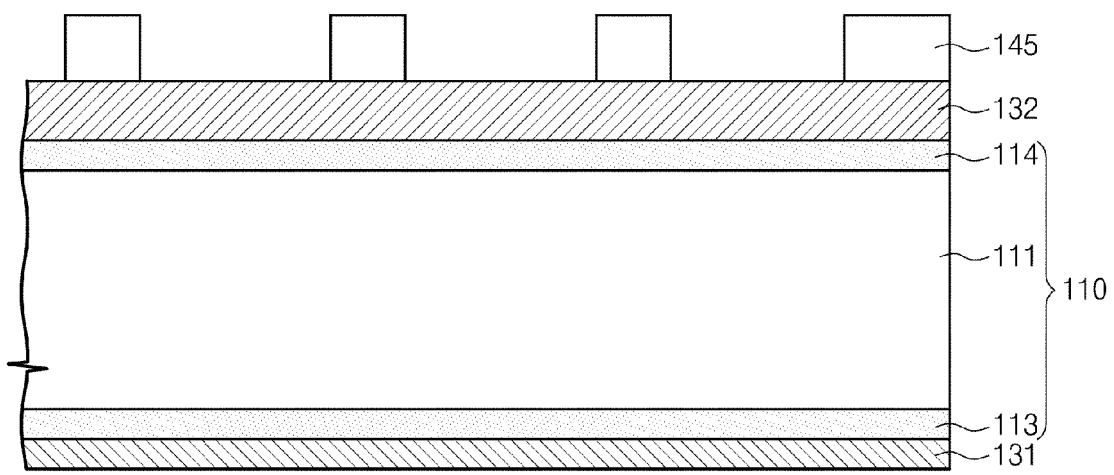

Referring to FIGS. 4A and 4B, a second conductive layer 132 may be provided on the second impurity-doped layer 114 of the light-receiving surface. The second conductive layer 132 may be formed from material selected from the group consisting of Al, Cu, Ni, W, Ti, TiN, WN, a metal silicide, or the like, or a combination thereof. In one embodiment, the second conductive layer 132 may comprise a stacked layer (e.g., comprising a plurality of layers in contact with one another). The second conductive layer 132 may be formed of, for example, Ti/TiN/Al or Ti/TiN/W. A photoresist (not shown) may be formed to cover the second conductive layer 132. The photoresist may then be etched to form a photoresist pattern 145, which exposes at least a portion of the second conductive layer 132.

Figure 5A:
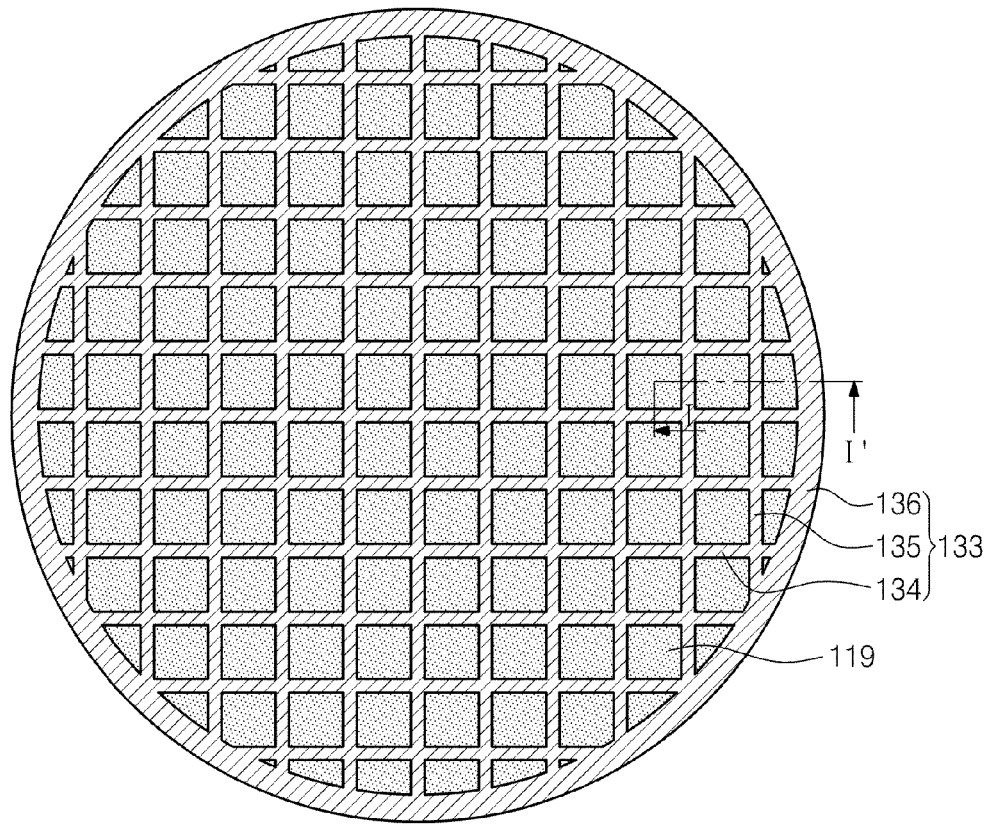
Figure 5B:
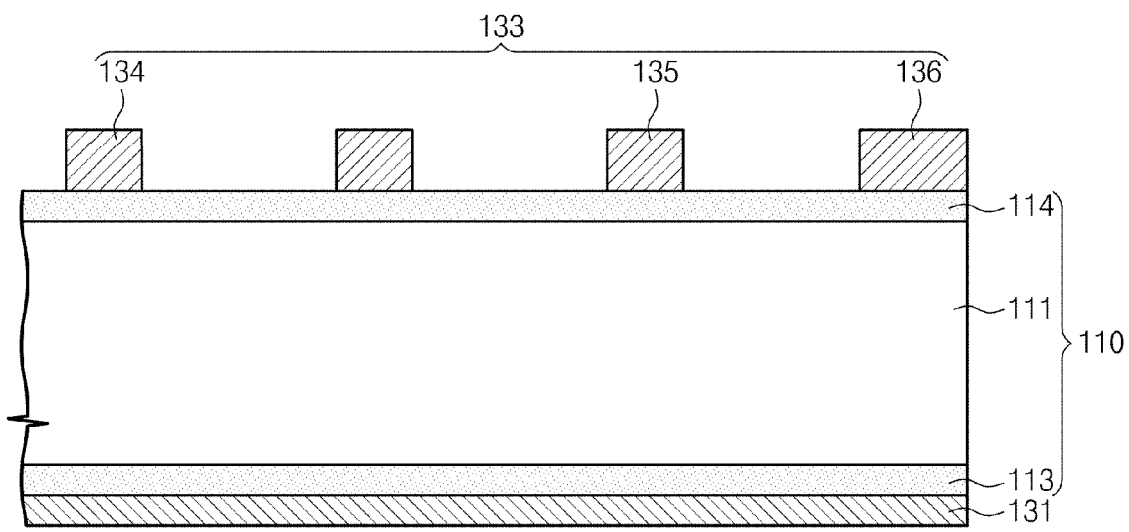

Referring to FIGS. 5A and 5B, the second conductive layer 132 may be patterned by an etching process using the photoresist pattern 145 as a mask to form the second electrode 133. The second electrode 133 may expose a portion of the light-receiving surface and divide the light-receiving surface into a plurality of unit regions 119. Each of the unit regions 119 may be surrounded by the second electrode 133. The second electrode 133 may have, for example, a grid shape. The second electrode 133 may include, for example, a first electrode part 134 extending in a first direction and a second electrode part 135 extending in a second direction; the second direction intersecting the first direction. The second electrode 133 may be formed to further include a third electrode part 136 which is connected to ends of the first electrode part 134 and ends of the second electrode part 135, and extends along the periphery of the edge of the semiconductor substrate 110.

Figure 6A:
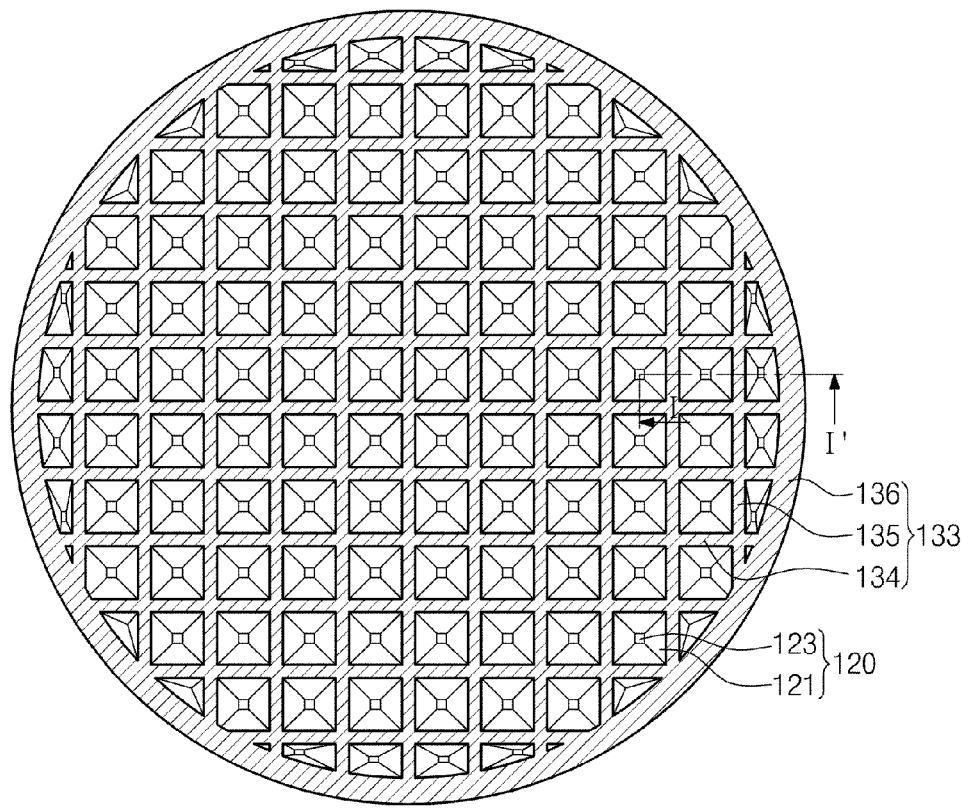
Figure 6B:
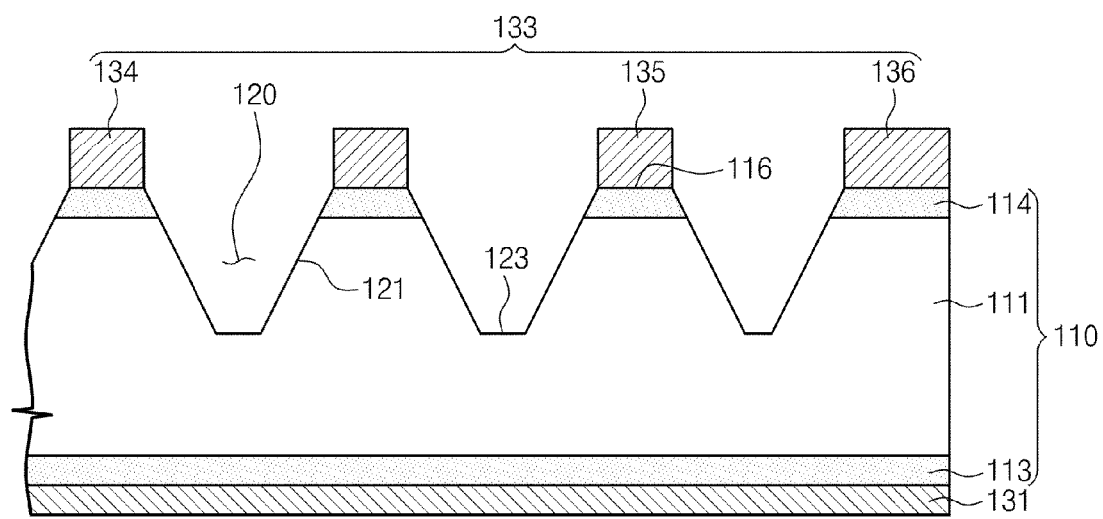

Referring to FIGS. 6A and 6B, the exposed portion of the light-receiving surface may be removed to form a plurality of recesses 120. The recesses 120 may be formed by extracting a portion of the light-receiving surface. The second impurity-doped layer 114 and an upper portion of the first region 111 may be removed by an etching process using the second electrode 133 as a mask. Since the second electrode 133 is used as the mask, a sidewall of the second electrode 133 may be self-aligned with the edge of the recesses 120. Proper control of the etching process allows a side surface (hereinafter referred to as "inclined surface") 121 of the respective recesses 120 to be inclined to the light-receiving surface. A bottom surface 123 extending from the inclined surface 121 may be formed at the center of the respective recesses 120. The bottom surface 123 may be substantially parallel with the light-receiving surface. In one embodiment, the bottom surface 123 may be substantially parallel with the bottom surface of the substrate 110. Due to the control of the etching process, the bottom surface 123 may decrease in size to be an inverted vertex. The recesses 120 may function as a texturing structure for efficiently receiving light. The light-receiving surface, covered with the second electrode 133 and disposed between the recesses 120, may have a protrusive surface 116. The second impurity-doped layer 114 may remain on the protrusive surface 116.

Figure 7A:
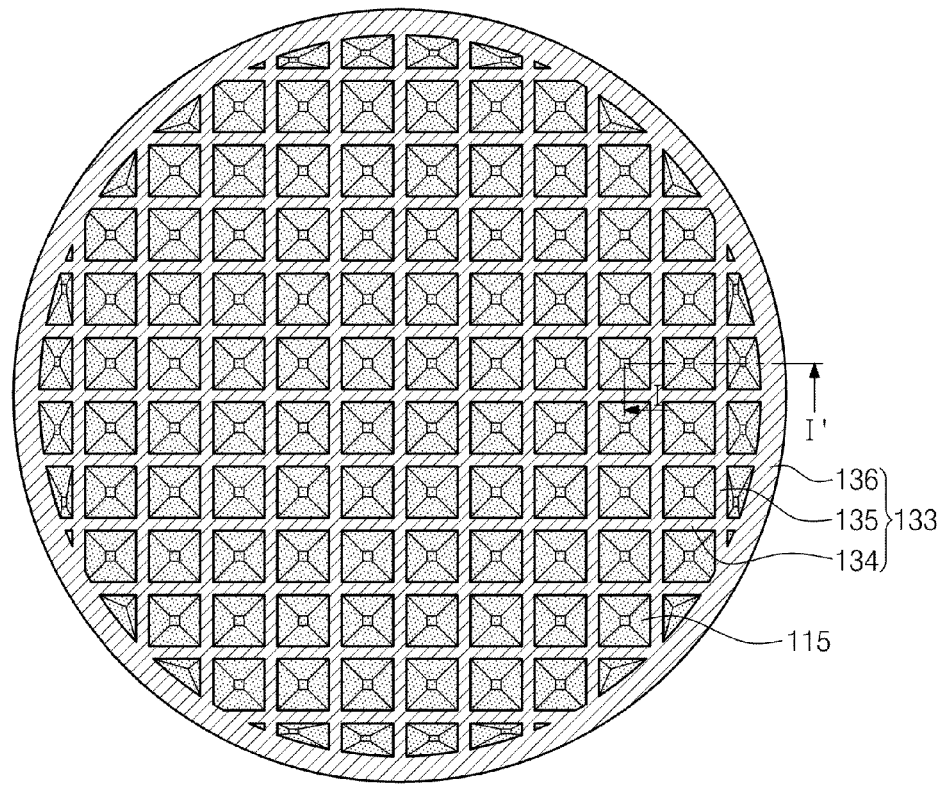
Figure 7B:
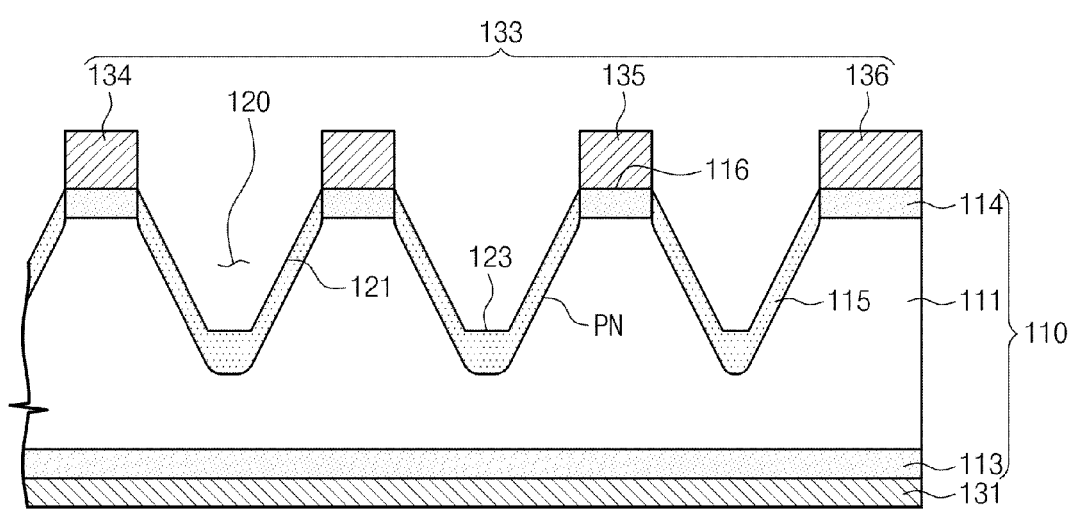

Referring to FIGS. 7A and 7B, a second region 115 of the second conductivity type may be formed at the recesses 120. In an embodiment, the second region 115 may be formed by heavily implanting impurities of the second conductivity type into the recesses 120 using the second electrode 133 as a mask and annealing the impurity-implanted recesses 120. A PN junction PN may be formed at the boundary between the first region 111 of the first conductivity type and the second region 115 of the second conductivity type.

Figure 8:
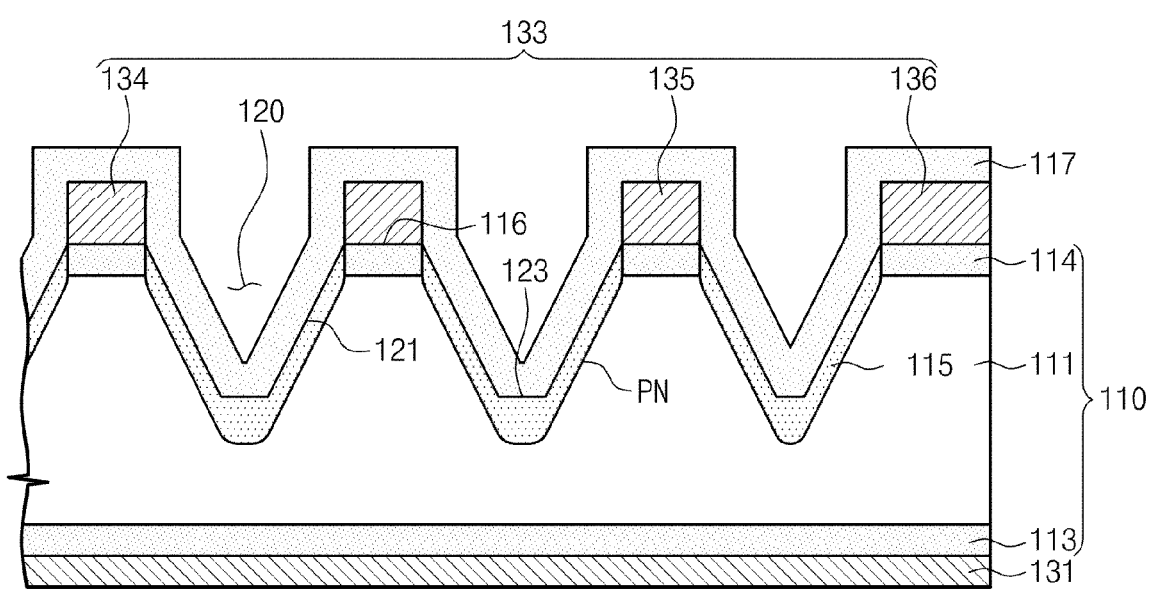
FIG. 8 is an exemplary schematic cross-sectional view of a solar cell, which is taken along the line corresponding to the line I-I' in FIG. 1A.

In another embodiment, referring to FIG. 8, the second region 115 may be formed by depositing an amorphous semiconductor layer 117 on the semiconductor substrate 110. That is, the amorphous semiconductor layer 117 heavily doped with impurities of the second conductivity type is formed on the semiconductor substrate 110. The doping concentration of the amorphous semiconductor layer 117 may be approximately $10^{19}$~$10^{21}$/cm$^3$. A thickness of the amorphous semiconductor layer 117 may be several angstroms to about 1000 Angstroms, specifically about 100 to about 800 Angstroms, and more specifically about 200 to about 700 Angstroms. In one embodiment, the thickness of the amorphous semiconductor layer 117 may be 600 Angstroms.

In one embodiment, in one method of manufacturing the amorphous semiconductor layer 117, a thin undoped amorphous semiconductor layer may be formed in the early stage and a doped amorphous semiconductor layer may be subsequently formed. The undoped amorphous semiconductor layer may be formed by plasma enhanced chemical vapor deposition ("PECVD") or low pressure chemical vapor deposition ("LPCVD") using silane (SiH$_4$) and hydrogen gas. The doped amorphous semiconductor layer may also be formed by PECVD or by LPCVD using SiH$_4$, phosphine (PH$_3$) and hydrogen gas. The thin undoped amorphous semiconductor layer may be doped with impurities of the second conductivity type (e.g., phosphorus).

After forming the amorphous semiconductor layer 117 on the semiconductor substrate 110 and doping the semiconductor layer 117, an annealing process may be conducted. During the annealing process, impurities (e.g., phosphorus (P)) of the second conductivity type included in the doped amorphous semiconductor layer 117 may diffuse to the undoped amorphous semiconductor layer and the upper portion of the underlying the first region 111 of the first conductivity type. The impurities of the second conductivity diffused to the upper portion of the first region 111 may form a second region 115 of the second conductivity type. The second region 115 may have a lower impurity concentration than the amorphous semiconductor layer 117 of the second conductivity type. A second conductive region including the second region 115 and the amorphous semiconductor layer 117 may function as the PN junction PN.

Referring to FIG. 2 again, an anti-reflection film 141 may be formed to cover the second region 115 and the second electrode 133. The anti-reflection film 141 may be formed of silicon oxide, silicon nitride or a stacked layer thereof. The anti-reflection film 141 may be formed by PECVD. In one embodiment, the amorphous semiconductor layer 117 and the anti-reflection film 141 both be disposed upon the second region 115.

By patterning the anti-reflection film 141, an opening 143 may be formed to expose a pad on the second electrode 133. The second electrode 133 may be connected to an exterior wiring 151 via the opening 143. The exterior wiring 151 enables power generated between the first and second electrodes 131 and 133 to be output to the exterior.

A solar cell module employing solar cells will now be described below in detail. Since one solar cell is capable of generating a voltage of approximately 0.5 volt, a solar cell module may be configured to obtain a voltage within the range of application by connecting a plurality of solar cells in series or parallel.

Figure 9:
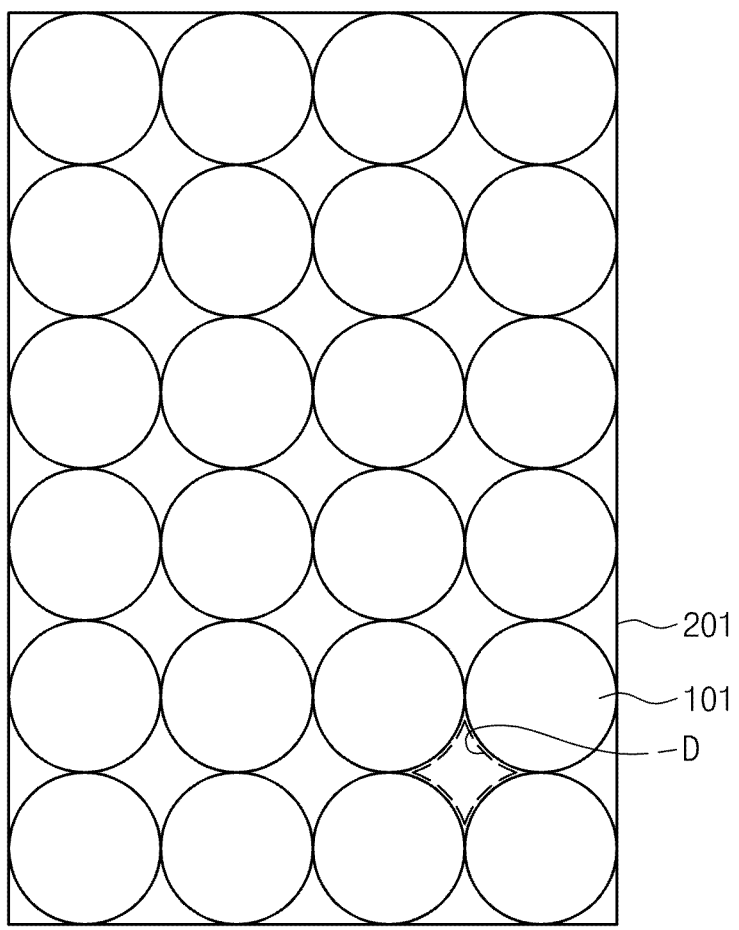
FIGS. 9 through 11 depict an exemplary schematic solar cell module employing solar cells.

Referring to FIG. 9, a solar cell module 210 may include a frame 201, and solar cells 101 disposed on the frame 201 and arranged in a matrix of rows and columns. As illustrated, each of the solar cells 101 may have the shape of a circular silicon wafer. In this case, there may be a dead area "D" which cannot generate electricity because the solar cells 101 are not disposed in the dead area.

Figure 10:
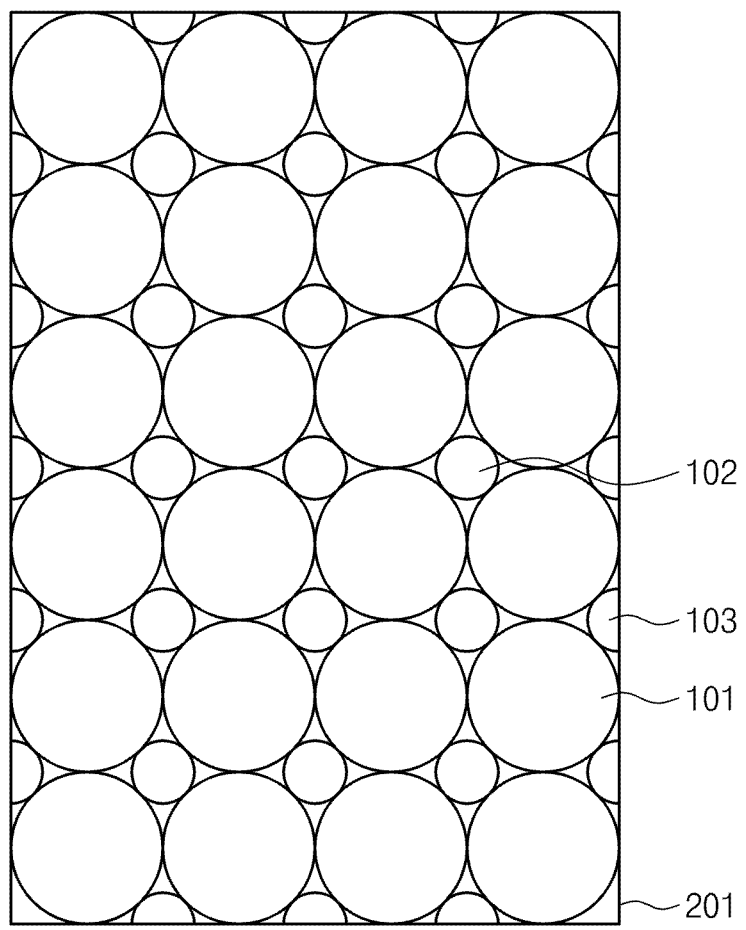

Referring to FIG. 10, a solar cell module 220 according to another embodiment may include a frame 201, a plurality of first solar cells 101 disposed on the frame 201, and a plurality of second solar cells 102. Each second solar cell is different in shape or size from each of the first solar cell 101. The first solar cells 101 may be arranged in a matrix of rows and columns. Each of the first solar cells 101 may have a substantially circular shape. Each of the second solar cells 102 may have the shape of a smaller circle than each of the first solar cells 101. The second solar cells 102 may be provided at a space surrounded by the first four solar cells 101. Semicircular third solar cells 103 may be further provided with the shape exhibited by cutting the second solar cells 102 along their diameters, respectively. At the edge of the frame 201, the third solar cells 103 may be provided in the space where the frame 201 is exposed by the first two solar cells 101. In this case, the dead area may occupy 8.5 percent of the total surface area of solar cell module 220.

Figure 11:
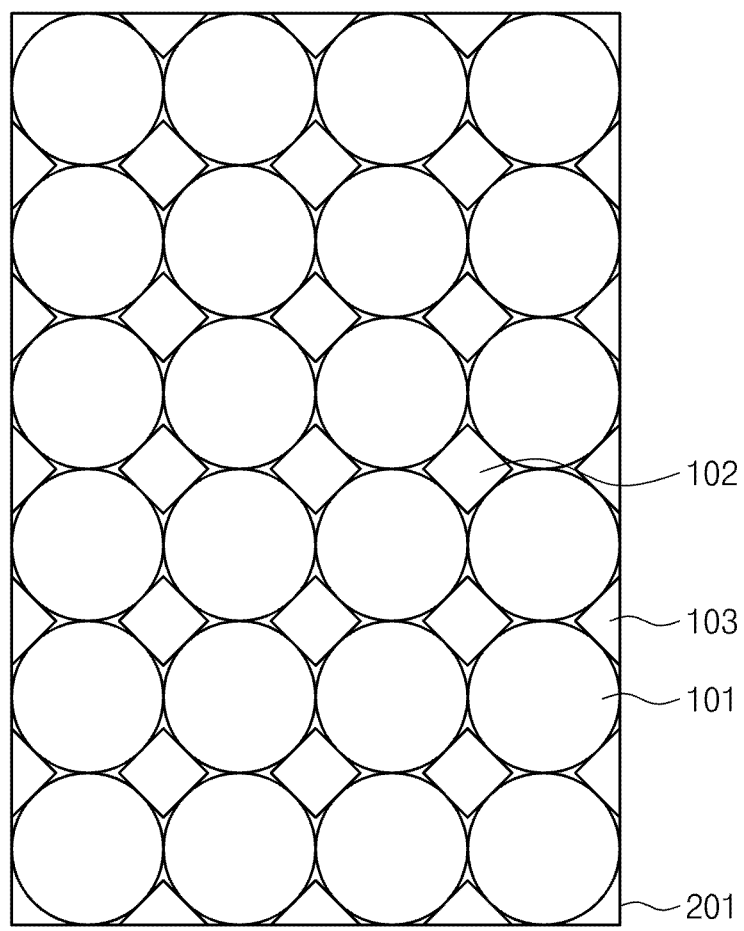

Referring to FIG. 11, a solar cell module 230 will be now described. Unlike FIG. 10, shapes of second solar cells 102 are not limited to the foregoing circular shape and shapes of third solar cells 103 are not limited to the foregoing semicircular shape. Shapes and sizes of the second and third solar cells 102 and 103 may be altered such that they are disposed within the area of the frame of the solar cell module that is not occupied by the first solar cells 101.

Each of the second solar cells 102 may have the shape of, for example, a smaller tetragon than each of the first solar cells 101. If each of the first solar cells 101 has a diameter of, for example, 8 inches, one side of the respective second solar cells 102 may have a length of 3.2 inches. If each of the first solar cells 101 has a diameter of, for example, 12 inches, one side of the respective second solar cells 102 may have a length of 5 inches. The third solar cells 103 may have a triangular shape exhibited by cutting the second solar cells 102 along their diagonals, respectively. In this case, a dead area may occupy 5 percent or less of the total surface area of the solar cell module 230. Thus, the energy efficiency of the solar cell module 230 may be increased to the greatest extent possible.

The above-described solar cells 101, 102, and 103 function as described in the FIGS. 1A through 8.

Figure 12:
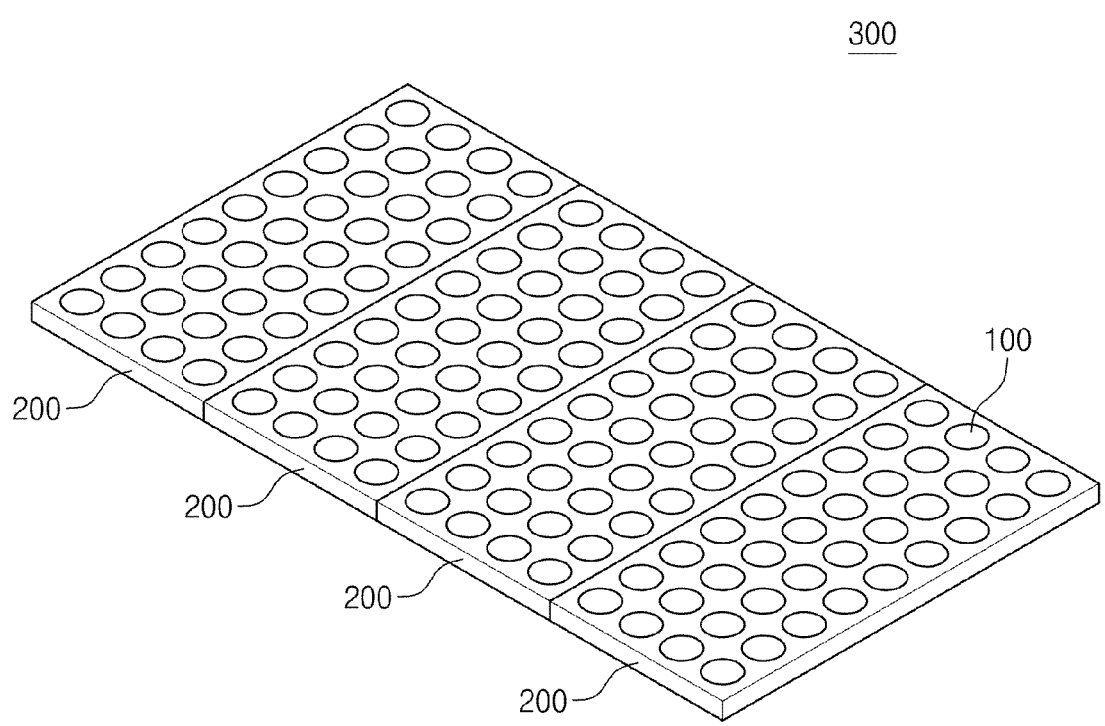
FIG. 12 depicts an exemplary schematic solar cell array employing solar cells.

Referring to FIG. 12, a solar cell array 300 employing the aforementioned solar cells will now be described. The solar cell array 300 may be configured with one or more solar cell modules 200 installed at a mainframe (not shown). The solar cell modules 200 may be the solar cell modules 210, 220, and 230 described with reference to FIGS. 9 through 11. The solar cell array 300 may be mounted in a manner to be effectively exposed to maximum radiation from the sun at all times when sunlight is available. In one embodiment, the solar cell array 300 may be mounted with a regular angle inclined to the south to be readily exposed to sunlight.

Figure 13:
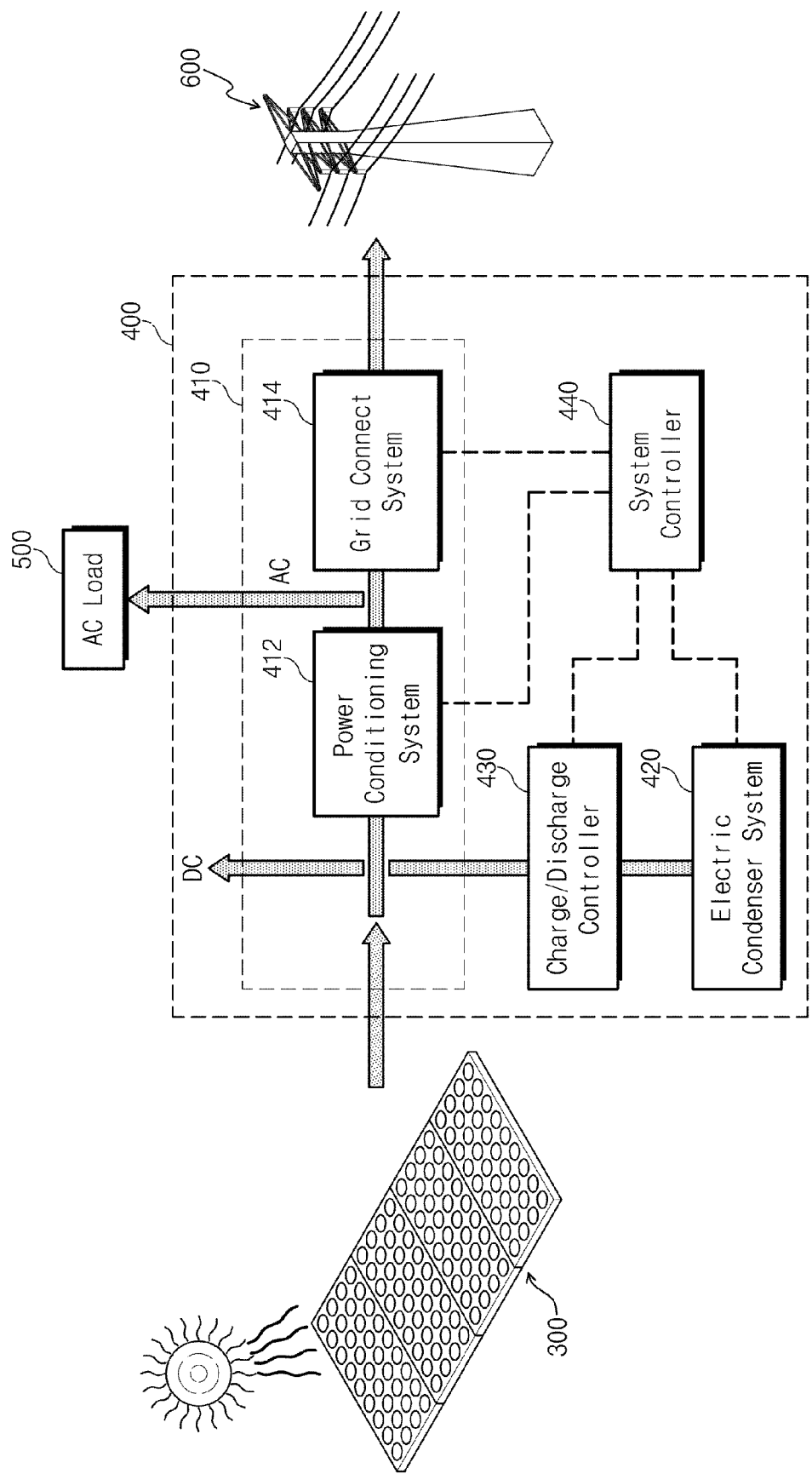
FIG. 13 depicts an exemplary schematic photovoltaic power generation system employing solar cells.

The above-described solar cell module or solar cell array may be mounted on automobiles, houses, buildings, ships, lighthouses, traffic signal systems, portable electronic devices, and various structures. An example of a photovoltaic power generation system employing solar cells will now be described with reference to FIG. 13. The photovoltaic power generation system may include a solar cell array 300 and a power control system 400 transmitting power provided from the solar cell array 300 to the exterior. The power control system 400 may include an output unit 410, an electric condenser system 420, a charge/discharge controller 430, and a system controller 440. The output unit 410 may include a power conditioning system (PCS) 412.

The PCS 412 may be an inverter for converting direct current from the solar cell array 300 to alternating current. Since sunlight does not exist at night and gets reduced on cloudy days, power generation may be reduced. The electric condenser system 420 may store electricity to provide steady power to users despite the weather. The charge/discharge controller 430 may store power provided from the solar cell array 300 in the electric condenser system 420 or output the electricity stored in the electric condenser system 420 to the output unit 410. The system controller 440 may control the output unit 410, the electric condenser system 420, and the charge/discharge controller 430.

As mentioned above, converted alternating current may be supplied to various AC loads 500 such as home and automobiles. The output unit 410 may further include a grid connect system 414, which may mediate connection to another power system 600 to transmit power to the exterior.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the invention.

What is claimed is:

1. A solar cell comprising:
    a semiconductor substrate comprising a light-receiving surface, wherein the semiconductor substrate comprises a plurality of recesses formed by recessing an exposed portion of the light- receiving surface;
    a back surface facing the light-receiving surface;
    a first region of a first conductivity type disposed on the back surface;
    a second region of a second conductivity type in the recesses on the light-receiving surface;
    a PN junction at a boundary between the first region of the first conductivity type and the second region of the second conductivity type;
    an electrode being disposed on the light-receiving surface and surrounding the plurality of recesses, wherein the electrode exposes a portion of the light-receiving surface; and
    an impurity-doped layer of the second conductivity type interposed between the electrode and the light-receiving surface of the semiconductor surface, wherein the impurity-doped layer of the second conductivity type is separate from and adjacent to the second region of the second conductivity type, wherein the second region of the second conductivity type and the impurity-doped layer of the second conductivity type are directly connected on the light-receiving surface of the semiconductor substrate to form a layer of the second conductivity type.

2. The solar cell as set forth in claim 1, wherein each recess of the plurality of recesses includes a side surface inclined with respect to the light-receiving surface.

3. The solar cell as set forth in claim 1, wherein the second region of the second conductivity type is aligned with the sidewall of the electrode.

4. The solar cell as set forth in claim 1, wherein the plurality of recesses function as a texturing structure for efficiently absorbing light.

5. The solar cell as set forth in claim 1, further comprising an anti-reflection film disposed to cover the electrode and the plurality of recesses.

6. The solar cell of claim 1, wherein the recesses of the plurality of recesses in a center of the light-receiving surface are periodic, and wherein the recesses of the plurality of recesses at the edges of the light receiving-surface are aperiodic.

7. The solar cell of claim 1, wherein each recess of the plurality of recesses is completely surrounded by the electrode.

8. The solar cell as set forth in claim 1, wherein a sidewall of the electrode is aligned with a side edge of the plurality of recesses.

9. The solar cell as set forth in claim 8, wherein the electrode comprises a first electrode part extending in a first direction and a second electrode part extending in a second direction, wherein the second direction intersects the first direction.

10. The solar cell as set forth in claim 9, wherein the electrode further comprises a third electrode part which is in contact with an end of the first electrode part and an end of the second electrode part, wherein the third electrode part extends along a periphery of an edge of the semiconductor substrate.

11. The solar cell as set forth in claim 1, wherein at least one recess in the plurality of recesses has a different size or shape than other recesses in the plurality of recesses.

12. The solar cell as set forth in claim 11, wherein recesses in the plurality of recesses formed at a center of the semiconductor substrate have uniform size or shape as compared with recesses in the plurality of recesses adjacent to an edge of the semiconductor substrate.

13. The solar cell as set forth in claim 11, wherein recesses in the plurality of recesses formed at the center of the semiconductor substrate have a uniform distribution as compared with recesses in the plurality of recesses adjacent to an edge of the semiconductor substrate.

* * * * *